(12) United States Patent
Xia et al.

(10) Patent No.: US 11,898,266 B2
(45) Date of Patent: Feb. 13, 2024

(54) METHOD FOR GROWING GALLIUM OXIDE SINGLE CRYSTAL BY CASTING AND SEMICONDUCTOR DEVICE CONTAINING GALLIUM OXIDE SINGLE CRYSTAL

(71) Applicant: Hangzhou Garen Semiconductor Co., Ltd., Hangzhou (CN)

(72) Inventors: Ning Xia, Hangzhou (CN); Hui Zhang, Hangzhou (CN); Keke Ma, Hangzhou (CN); Yingying Liu, Hangzhou (CN); Deren Yang, Hangzhou (CN)

(73) Assignee: Hangzhou Garen Semiconductor Co., Ltd., Hangzhou (CN)

( * ) Notice: Subject to any disclaimer, the term of this patent is extended or adjusted under 35 U.S.C. 154(b) by 0 days.

(21) Appl. No.: 17/812,186

(22) Filed: Jul. 13, 2022

(65) Prior Publication Data
US 2023/0340689 A1  Oct. 26, 2023

(30) Foreign Application Priority Data
Apr. 26, 2022  (CN) .......................... 202210441289.5

(51) Int. Cl.
  *C30B 11/06*   (2006.01)
  *C30B 11/00*   (2006.01)
  *C30B 29/16*   (2006.01)
(52) U.S. Cl.
  CPC ............ *C30B 11/003* (2013.01); *C30B 11/06* (2013.01); *C30B 29/16* (2013.01)

(58) Field of Classification Search
  CPC ........ C30B 11/003; C30B 11/06; C30B 29/16
  See application file for complete search history.

(56) References Cited

U.S. PATENT DOCUMENTS

2020/0115817 A1*  4/2020  Hoshikawa ............. C30B 29/16

FOREIGN PATENT DOCUMENTS

| CN | 112853468 | * | 5/2021 |
| CN | 113774484 | * | 12/2021 |
| CN | 215440759 | * | 1/2022 |
| CN | 114108083 | * | 3/2022 |
| EP | 3042986 | * | 7/2016 |

* cited by examiner

*Primary Examiner* — Robert M Kunemund
(74) *Attorney, Agent, or Firm* — DLA PIPER LLP (US)

(57) ABSTRACT

The disclosure provides a method for growing a gallium oxide single crystal by casting and a semiconductor device containing the gallium oxide single crystal. The method includes: 1) heating a solid gallium oxide to complete melting, cooling to a melting point of the gallium oxide, and maintaining a melt state for at least 30 min; and 2) conducting gradient cooling on a gallium oxide melt obtained in step 1) until a solid gallium oxide single crystal is obtained. The gradient cooling is to cool the gallium oxide melt obtained in step 1) to a first temperature according to a first gradient, and then continue cooling to a room temperature according to a second gradient to obtain the gallium oxide single crystal. In step 1), since the solid gallium oxide is heated to the first temperature, oxygen with a volume fraction of at least 2% is present in a growth atmosphere.

5 Claims, 3 Drawing Sheets

Growth flow of CZ method or EFG method:

Growth flow of casting method:

METHOD FOR GROWING GALLIUM OXIDE SINGLE CRYSTAL BY CASTING AND SEMICONDUCTOR DEVICE CONTAINING GALLIUM OXIDE SINGLE CRYSTAL

CROSS REFERENCE TO RELATED APPLICATION

This patent application claims the benefit and priority of Chinese Patent Application No. 202210441289.5, filed on Apr. 26, 2022, the disclosure of which is incorporated by reference herein in its entirety as part of the present application.

TECHNICAL FIELD

The present disclosure belongs to the technical field of semiconductors, and in particular, to a method for growing a gallium oxide single crystal by casting and a semiconductor device containing the gallium oxide single crystal.

BACKGROUND ART

Semiconductor materials are the cornerstone of the semiconductor industry and also play an important role in promoting the development of modern information technology. Gallium oxide ($\beta$-$Ga_2O_3$), as a new generation of ultra-wide bandgap semiconductor materials, features a large bandgap (4.8 eV), a large transmission range (260-2,500 nm), high breakdown electric field strength (8 MV/cm), a large Baliga' figure of merit, and stable physical and chemical properties. Recent studies have shown that the gallium oxide single crystal substrate has great application value in the fields of power devices, optoelectronic devices, and sensors, and is one of the important substitutes for wide bandgap semiconductor materials including silicon carbide and gallium nitride. Compared with silicon carbide and gallium nitride crystals that can only be produced on a large scale by the gas phase method (growth rate of about 10-1 mm/h), gallium oxide crystals can be produced on a large scale by the melt method (growth rate of about 10 mm/h), which effectively reduces the preparation cost of materials. Therefore, the gallium oxide crystals have very broad application prospects. (All gallium oxides herein are $\beta$-$Ga_2O_3$ unless otherwise stated).

There are two types of crystals: single crystals and polycrystals. A single crystal means that the atoms or molecules in its crystal structure are arranged periodically and repeatedly according to certain rules. Polycrystals are composed of many small grains, and the arrangement of grains is irregular. Due to the difference in structure between the single crystal and the polycrystal, the single crystal of the same material has higher mechanical strength and breakdown voltage than the polycrystal. Many current studies have shown that gallium oxide material can exert its light, high-voltage resistant, and stable performance in electronic devices only under the condition of single crystal.

Different from low-dimensional materials such as gallium oxide nanoparticles (0-dimensional), nanowires (1-dimensional), and single crystal films (2-dimensional), a bulk gallium oxide single crystal is solid material with three-dimensional dimensions (as shown in FIG. 1), which has dimensions of the order of at least 10 mm in all three dimensions. At present, the bulk gallium oxide single crystals can be prepared by a variety of melt methods, such as: the floating zone (FZ) method, the heat exchanger method (HEM), the Bridgman method (horizontal Bridgman (HB) or vertical Bridgman (VB) method), the Czochralski (CZ) method (also known as the crystal pulling method), and the edge-defined film-fed growth (EFG) method. The common point of these methods to obtain the gallium oxide single crystal is that a gallium oxide single crystal seed shall be used. During growth, the crystal seed can be fixed or move in one direction to induce the gallium oxide single crystal to grow along the crystal seed.

Taking the CZ method (such as Chinese patent CN104372408B) and the EFG method (such as Chinese patent CN103290471A) in the current gallium oxide single crystal growth methods as examples, during growth of the gallium oxide single crystal, the gallium oxide single crystal seed should be introduced from outside the system, for example, introducing a gallium oxide single crystal seed with a specific crystal orientation (such as <010> direction) or a specific shape (fine rod or sheet), the crystal seed is lowered to contact the surface of the gallium oxide melt, and then the crystal seed is raised and the growth conditions are controlled, such that the melt gradually solidifies at the lower end of the crystal seed to grow a single crystal, and continues to rise until the single crystal grows out of the melt level and the crucible. It can be seen that in the existing methods for preparing the gallium oxide single crystals, including but not limited to the FZ method, the Bridgeman method, the CZ method, and the EFG method, the single crystal seed or the seeding process is currently a necessary condition for obtaining the gallium oxide single crystals. FIG. 2 shows an image of a gallium oxide single crystal prepared by the CZ method. There is an obvious fine or tip part on the left side at the left end, indicating that a crystal seed is used in the growth process (Blevins, J. D.; Stevens, K.; Lindsey, A.; Foundos, G.; Sande, L. Development of Large Diameter Semi-Insulating Gallium Oxide ($Ga_2O_3$) Substrates. IEEE Transactions on Semiconductor Manufacturing 2019, 32(4), 466-472). FIG. 3 shows an image of a gallium oxide single crystal prepared by the EFG method. The tip part on the left side indicates that a crystal seed is used in the growth process (Kuramata, A.; Koshi, K.; Watanabe, S.; Yamaoka, Y.; Masui, T.; Yamakoshi, S., High-quality $\beta$-$Ga_2O_3$ single crystals grown by edge-defined film-fed growth. Japanese Journal of Applied Physics 2016, 55 (12), 1202A2). It can be clearly seen from FIG. 2 and FIG. 3 that the left side of the gallium oxide single crystal obtained by the CZ method or the EFG method has an obvious taper-like finer part or tip part, which proves that the growth process of the gallium oxide single crystal includes a seeding process, which necessarily uses a single crystal seed introduced from the outside.

It should be emphasized that it is very difficult to obtain the gallium oxide single crystal seeds. At present, there are almost no commercially available gallium oxide single crystal seeds. On the one hand, commercial gallium oxide single crystal substrates cannot be used as crystal seeds. On the one hand, the commercial gallium oxide single crystal substrates are too thin to bear the load and cannot be used as crystal seeds. Therefore, in order to prepare a gallium oxide single crystal used as a crystal seed, a pre-step for preparing a gallium oxide single crystal seed is necessary. At present, only large gallium oxide crystals can be obtained through multiple growth attempts, then single crystal parts are cut, and single crystal seeds are obtained by processing. Crystal seeds are short and often cannot be reused. The processing of the gallium oxide single crystal seeds is also full of challenges. On the one hand, since the gallium oxide single crystals have two cleavage planes, it is easy to produce cleavage phenomena when cutting from bulk gallium oxide crystals (Galazka, Z.; Uecker, R.; Irmscher, K.; Albrecht, M.; Klimm, D.; Pietsch, M.; Brützam, M.; Bertram, R.; Ganschow, S.; Fornari, R., Czochralski growth and characterization of β-Ga$_2$O$_3$ single crystals. Crystal Research and Technology 2010, 45 (12), 1229-1236). The cleavage phenomenon refers to the phenomenon that after the crystal is stressed, due to its own crystal structure, the crystal cracks along a certain crystal plane into a smooth plane. On the other hand, when the crystal seed is polished and opened, it is easy to crack and break, which makes the crystal seed unusable. In addition, since the crystal seed is usually thin (usually no more than 5 mm in diameter or side length) and needs to bear the entire single crystal weight during growth, there is a greater risk of fracture. Defective crystal seeds or improper crystal growth operations cause the entire single crystal to fall off and fall back into the melt, resulting in crystal growth failure.

Even with the gallium oxide single crystal seed, it is very difficult to obtain the large-size bulk gallium oxide single crystal, and it is more difficult to obtain the high-quality large-size bulk gallium oxide single crystal (with less crystal defects and full width at half maximum (FWHM) of rocking curve less than or equal to 150 arcsec). The large-size bulk gallium oxide single crystal refers to: a bulk gallium oxide single crystal with a diameter of at least 2 inches (50.8 mm) and a thickness of at least 10 mm. The melting point of gallium oxide itself is very high (about 1,800° C.), and it is very easy to volatilize and decompose at high temperature. There are high requirements for crystal growth equipment, and the process of growing the gallium oxide single crystal according to the CZ method or the EFG method is very complex, including growth steps such as crystal seed production, material melting, seeding, necking, shouldering, cylindrical growth, tailing, and cooling (see FIG. 4 for the process flow). Each step requires different process parameters (including growth atmosphere, heating power, pulling rate, and crystal rotation rate). The process is complex and time-consuming, and there are still many technical problems in the two key steps of seeding and diameter control (Galazka, Z.; Uecker, R.; Klimm, D.; Irmscher, K.; Naumann, M.; Pietsch, M.; Kwasniewski, A.; Bertram, R.; Ganschow, S.; Bickermann, M., Scaling-Up of Bulk β-Ga$_2$O$_3$ Single Crystals by the Czochralski Method. ECS Journal of Solid State Science and Technology 2017, 6 (2), Q3007-Q3011). During seeding, on the one hand, it is necessary to find a suitable melt temperature. If the melt temperature is too high, the crystal seed melts. If the temperature is too low, the crystal seed contacts the liquid level, resulting in rapid crystallization on the melt surface. On the other hand, during seeding, it shall be ensured that the cold core position where the melt surface temperature is the lowest is contacted, and it is prone to spiral or twinning if the crystal is not seeded at the cold core position, resulting in poor crystal quality. Cylindrical growth is the main weight gain stage of single crystal growth. At this stage, the growth rate of the single crystal is the highest, but maintaining the diameter of the single crystal unchanged requires real-time adjustment of process parameters such as heating power and pulling rate. There are also high requirements for the regulation of thermal field of single crystal growth. The above technical problems require experienced crystal growth personnel and more research to further optimize and solve, and there is currently no good solution.

The gallium oxide single crystal growth method using crystal seeds is more prone to problems such as bubble defects, cleavage, cracking, twinning and spiral growth as the size of the single crystal expands to at least 2 inches, and there are many unstable factors. It is difficult to obtain high-quality bulk gallium oxide single crystals by the CZ method (for example, in FIG. 1c and FIG. 1d in Mu, W.; Jia, Z.; Yin, Y.; Fu, B.; Zhang, J.; Zhang, J.; Tao, X., Solid-liquid interface optimization and properties of ultra-wide bandgap β-Ga$_2$O$_3$ grown by Czochralski and EFG methods. CrystEngComm 2019, 21 (17), 2762-2767, the diameter of the crystal is less than 25 mm and the length is less than 35 mm). In addition, the EFG method needs to add a set of precious metal dies on the basis of the CZ method to assist the growth. The die usually contains a slit structure so that the melt rises to the top of the die through capillary action. The size of the single crystal obtained by the EFG method is determined by the shape and size of the top edge of the die. Therefore, the gallium oxide single crystal is usually slab and the thickness is generally 2-4 mm (with reference to Tao, X.; Mu, W.; Jia, Z. Research Progress in the Crystal Growth and Devices of Wide-Bandgap β-Ga$_2$O$_3$. Materials China 2020, 39(02), 113-123, see crystals produced by EFG method in FIG. 7 and FIG. 8 in this paper for details). Due to the limitations of the [010]-oriented crystal seed, growth direction and die, it is difficult to obtain large-size bulk gallium oxide single crystals with a thickness of at least 10 mm for slab crystals by the EFG method. Large-size single crystal substrates (at least 2 inches in diameter) are usually processed in the main growth plane (201) plane and the (001) plane (parallel to the growth direction), but large-size substrates cannot be obtained in the (010) plane (perpendicular to the growth direction). Currently, the fabrication of some important semiconductor devices requires high-quality large-size (010) plane gallium oxide single crystal substrates.

It can be seen that the current growth method for the gallium oxide single crystal needs to use the gallium oxide single crystal seed, the growth process is complex, and there are many factors that need to be controlled. There are high requirements for crystal growth technicians, and there are huge technical barriers, which limit large-scale preparation of the high-quality large-size bulk gallium oxide single crystals with a diameter of at least 2 inches.

Casting belongs to the melt method, which usually refers to the method of melting solid raw materials into liquid, pouring the liquid into containers such as molds or crucibles, and then cooling and solidifying to obtain solid substances. However, casting generally obtains polycrystalline materials (such as Chinese patents CN101935867A, CN102560641A and CN106676628A). This is because in the growth process of conventional casting, it is difficult to control the process of cooling and solidification of materials, which is easy to form polycrystals by multi-point nucleation in the melt, and single crystals in large volumes cannot be grown. Therefore, there is no precedent in academia and industry to grow single crystal materials by casting. At present, single-crystal-like materials can be grown by casting in the field of casting monocrystalline silicon (such as Chinese patent CN101597788B). The actually obtained single crystal silicon is actually mono-like, not a single crystal in the strict sense. The crystal part in contact with the sidewall of the crucible usually forms polycrystalline silicon, and there are still a large number of defects such as grain boundaries in the cast monocrystalline silicon (1. Su, L.; Hao, Q.; Xie, X.; Liu, C.; Liu, X. Research Progress on Mono-like Silicon Technology. Bulletin of the Chinese Ceramic Society 2012, 31(03), 609-612. 2. Zhang, F. Modulation and Related Mechanism of Dislocations in Cast Quasi-single Crystalline Silicon. 2019, Zhejiang University, MA thesis). The method is to lay dislocation-free silicon single crystal seeds at the bottom of the crucible, then lay polycrystalline silicon material on the crystal seeds, and use graphite resistance heating method to heat up, so that the raw materials are melted and monocrystalline silicon starts to grow from each crystal seed. According to the current equipment and technology, casting cannot be directly applied to the growth of bulk gallium oxide single crystals for the following reasons: firstly, the melting point of gallium oxide (1,800° C.) is much larger than that of silicon (1,410° C.), and the conventional growth equipment cannot be simply applied. Secondly, oxygen is generated during the growth of gallium oxide crystals, and conventional graphite resistance heating and graphite insulation materials cannot be used (graphite burns or even explodes when exposed to oxygen). Finally, according to the current casting technology, a large number of gallium oxide single crystal seeds shall be laid at the bottom of the crucible to make the crystal grow from bottom to top, which will easily lead to more nucleation points and impurity defects at the initial growth stage to form polycrystals, and it is difficult to form high-quality bulk gallium oxide single crystal. Therefore, there is currently no technical method for growing large-size bulk gallium oxide single crystals by casting without single crystal seeds.

SUMMARY

In view of the problems in the existing gallium oxide single crystal growth technology that a single crystal seed shall be used, a growth process is complex, and a diameter is too small, the present disclosure provides a casting growth method for a large-size bulk gallium oxide single crystal with a diameter of at least 2 inches and a thickness more than 10 mm with a simple process and without using the single crystal seed.

The present disclosure provides a method for growing a gallium oxide single crystal by casting, including the following steps:

1) heating a solid gallium oxide to complete melting, cooling to a melting point of the gallium oxide, and maintaining a melt state for at least 30 min; and 2) conducting gradient cooling on a gallium oxide melt obtained in step 1) until a solid gallium oxide single crystal is obtained, where the gradient cooling is to cool the gallium oxide melt obtained in step 1) to a first temperature according to a first gradient, and then continue cooling to a room temperature according to a second gradient to obtain the gallium oxide single crystal, and the first gradient and the second gradient are equal or unequal.

In step 1), since the solid gallium oxide is heated to the first temperature, oxygen with a volume fraction of at least 2% is present in a growth atmosphere. The growth atmosphere contains an inert gas.

The gallium oxide melt obtained in step 1) needs to be held for a certain period of time (usually at least 30 min, and the preferred holding time is 30-50 min). During cooling according to the first gradient, the method does not use the single crystal seed, nucleation and crystallization are first started at the cold core of the melt surface with the lowest temperature, and there is no need to use the single crystal seed to induce crystal growth. When a large single crystal has been formed on the melt surface or a single crystal is completely formed, this is a first temperature range. It is necessary to make the oxygen with a volume fraction of at least 2% exist in the growth atmosphere, adjust the cooling rate, and use the second gradient for cooling to the room temperature. These conditions can stabilize the melt, reduce the convection of the melt, avoid the influence of the temperature fluctuation of the melt surface on the nucleation, and avoid the existence of solid particles in the melt. During cooling, multi-point nucleation cannot form the single crystal. When the high temperature is reached, the volume fraction of the oxygen is increased to form a mixed atmosphere of inert gas and oxygen in a crystal growth furnace, which not only inhibits the volatilization and decomposition of gallium oxide, but also avoids the oxidation loss of the iridium crucible at low temperature. As the temperature gradually decreases along the gradient (the first gradient), the single crystal gradually starts to grow along the melt surface (the first temperature range). At this time, it is necessary to adjust the cooling rate (the second gradient) to avoid the formation of polycrystals due to the excessive growth rate, such that the single crystal starts to grow from top to bottom, and finally a large-size bulk gallium oxide single crystal is formed. The present disclosure can grow a bulk gallium oxide single crystal with a diameter of at least 2 inches and a thickness of at least 10 mm, and even can grow a bulk gallium oxide single crystal with a diameter of at least 4 inches and a thickness of at least 10 mm.

The room temperature refers to 25° C.±5° C.

Preferably, the solid gallium oxide has a purity greater than or equal to 99.999%. The purity of the solid gallium oxide is selected to be greater than or equal to 99.999%, which can reduce the introduction of impurities and improve the quality of the obtained gallium oxide crystal when growing the gallium oxide crystal.

The solid gallium oxide in the present disclosure can be gallium oxide powder or a gallium oxide solid.

Preferably, a preparation method for the gallium oxide solid includes: pressing the gallium oxide powder into a disk under a certain pressure. The disk is sintered into the gallium oxide solid at a high temperature.

The gallium oxide solid in the present disclosure can directly use commercially available gallium oxide solid, or can be prepared by using the preparation method. Pressing the gallium oxide powder into a disk can effectively reduce the volume of raw materials in the preparation container (such as the iridium crucible), and avoid multiple filling and melting.

In the whole preparation process of the gallium oxide crystal, in order to keep the temperature constant, the zirconia fiber brick is selected as the insulation material to form a suitable temperature gradient, which directly affects the growth of the gallium oxide single crystal.

Further, the method does not use a single crystal seed.

Further, a cooling rate of the first gradient may be at least 10° C./h.

Further, the cooling rate of the first gradient is 10-90° C./h. Preferably, the cooling rate of the first gradient is 10-40° C./h. If the cooling rate of the first gradient is too high, polycrystals are directly formed, and single crystals cannot be obtained.

Further, a cooling rate of the second gradient may be larger than the cooling rate of the first gradient.

Further, the cooling rate of the second gradient may be at least 20° C./h.

Further, the cooling rate of the second gradient is 20-100° C./h. Preferably, the cooling rate of the second gradient is 20-60° C./h. The cooling rate of the second gradient should not be too high, which may easily lead to crystal cracking.

Further, in step 1), before or when heating to the first temperature, the oxygen may be introduced so that the volume fraction of the oxygen in the growth atmosphere may reach at least 2%.

Further, the oxygen has a volume fraction of 2-10% in the growth atmosphere. Preferably, the oxygen has a volume fraction of 5% in the growth atmosphere.

Further, in step 2), when the cooling is continued to the first temperature according to the first gradient, the oxygen in the growth atmosphere may be replaced with an inert gas.

Further, the inert gas may be one or more selected from the group consisting of argon, nitrogen, and carbon dioxide.

Replacing the oxygen-containing atmosphere of the crystal growth furnace with an inert gas can reduce the oxygen in the furnace and avoid the oxidation damage of the iridium crucible.

Further, the first temperature may be 1,500-1,700° C.

Further, the gallium oxide single crystal is a bulk gallium oxide single crystal with a diameter of at least 2 inches and a thickness of at least 10 mm.

The present disclosure further provides a gallium oxide single crystal, which is prepared by the aforementioned method.

The present disclosure further provides a semiconductor device, containing the gallium oxide single crystal as described above.

By summarizing the various existing gallium oxide growth techniques (including the CZ method and the EFG method), it is concluded that in order to obtain the bulk gallium oxide single crystal with a diameter greater than 2 inches, the single crystal seed shall be used, which inevitably brings about various problems in the processing and production of the crystal seed, as well as various complex growth processes for controlling the growth of the bulk single crystal on the crystal seed during growth. The present disclosure overcomes the above technical prejudices, and obtains the bulk gallium oxide single crystal with a large size (diameter greater than 2 inches, even 3-4 inches) without using the single crystal seed.

In addition, the present disclosure also overcomes the prejudice that the prior art cannot prepare the large-size bulk gallium oxide single crystal by casting.

Due to the low thermal conductivity of the gallium oxide material itself, it is usually regarded as a disadvantage in device applications. However, in the growth process of the casting method, the low thermal conductivity of gallium oxide makes the temperature of the melt easy to maintain a relatively stable change. In addition, with the strict control of heat preservation and gradient cooling conditions, the subcooling degree of the melt and the stability of the solid-liquid interface can be well controlled, that is, the process of material cooling and solidification can be controlled. Since the gallium oxide itself is relatively easy to spontaneously nucleate at the cold core position, the melt can gradually solidify into a single crystal from top to bottom without adding external seeds to initiate nucleation. With a relatively high density, the impurity iridium in the melt is usually in the bottom layer of the melt, and the top-down growth makes the bottom layer region with high impurity concentration finally crystallized, which further avoids the possibility of multi-point nucleation.

Through the precise control of the growth temperature and regulation of the growth atmosphere, the cost of crystal growth, the time of crystal growth, and the difficulty of the process are reduced, which is one of the effective ways to solve the problem of growth size and cost of the bulk gallium oxide single crystal.

The present disclosure has the following beneficial effects:

1. The method for growing a gallium oxide single crystal by casting provided by the present disclosure does not need to introduce and use the single crystal seed from the outside, and the bulk gallium oxide single crystal is directly grown in the crucible by casting, which has a thickness reaching at least 10 mm and a diameter reaching at least 2 inches. Large-size single crystal substrates with different crystal planes can be processed.

2. The method for growing a gallium oxide single crystal by casting provided by the present disclosure does not require the production and use of the single crystal seed, and omits manual operations with many changing factors such as seeding, necking, shouldering, cylindrical growth, and tailing. The crystal growth process is greatly simplified and can be automatically controlled by precise programs, and the crystal growth time and processing time are also effectively shortened. The method of the present disclosure has lower requirements for equipment and reduces the cost of crystal growth.

3. According to the method for growing a gallium oxide single crystal by casting provided by the present disclosure, since the temperature gradient in the crucible is relatively low, the thermal stress of the gallium oxide single crystal in the crucible is also very small, and the gallium oxide single crystal taken out is not easy to crack, and annealing is not required. The method of the present disclosure avoids the necessary annealing step for the gallium oxide crystal obtained by the CZ method and the EFG method, and further reduces the processing time of the material.

4. The method for growing a gallium oxide single crystal by casting provided by the present disclosure utilizes effective control of growth temperature, the mixed growth atmosphere of inert atmosphere and oxygen, and less growth time, which overcomes the problem of volatilization and decomposition after reaching the melting point in the growth process of the gallium oxide crystal, and reduces the corrosion and loss of the crucible.

5. The gallium oxide single crystal obtained by the method provided by the present disclosure can be applied to the fields of semiconductor devices such as power devices, optoelectronic devices, and sensors after being processed, and large-size gallium oxide single crystal substrates can be produced on a large scale with high efficiency and low cost.

DETAILED DESCRIPTION OF THE EMBODIMENTS

The present disclosure will be further described below with reference to specific examples. In the following examples, a method for growing a gallium oxide single crystal by casting provided by the present disclosure is adopted. The solid gallium oxide raw material is put into a metal crucible and heated by intermediate frequency induction to a fully melted melt. Without using a single crystal seed, and by controlling a first temperature, a melting point holding time, a growth atmosphere, and gradient cooling conditions, the melt is gradually solidified. The gallium oxide single crystal grown by casting has a diameter of at least 2 inches and a thickness of at least 10 mm.

The following examples are only a preferred specific implementation method of the present disclosure, and should not be construed as a limitation on the protection scope of the present disclosure. Replacement or non-essential improvements made by those skilled in the art according to the solution of the present disclosure within the technical scope disclosed by the present disclosure all belong to the protection scope of the present disclosure.

Figure 1:
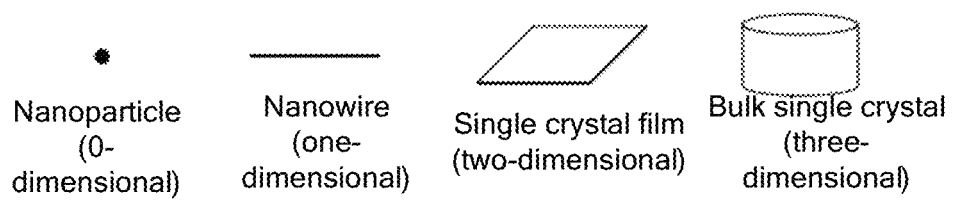
FIG. 1 is a schematic diagram of gallium oxide single crystal materials of different dimensions.
Figure 2:
FIG. 2 shows an image of a gallium oxide single crystal prepared by a CZ method.
Figure 3:
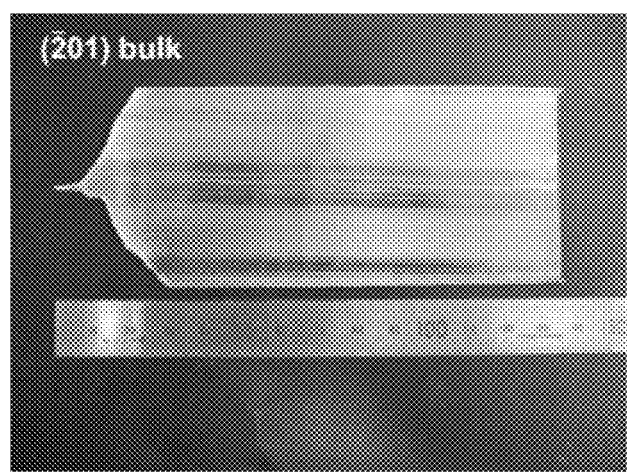
FIG. 3 shows an image of a gallium oxide single crystal prepared by an EFG method.
Figure 4:
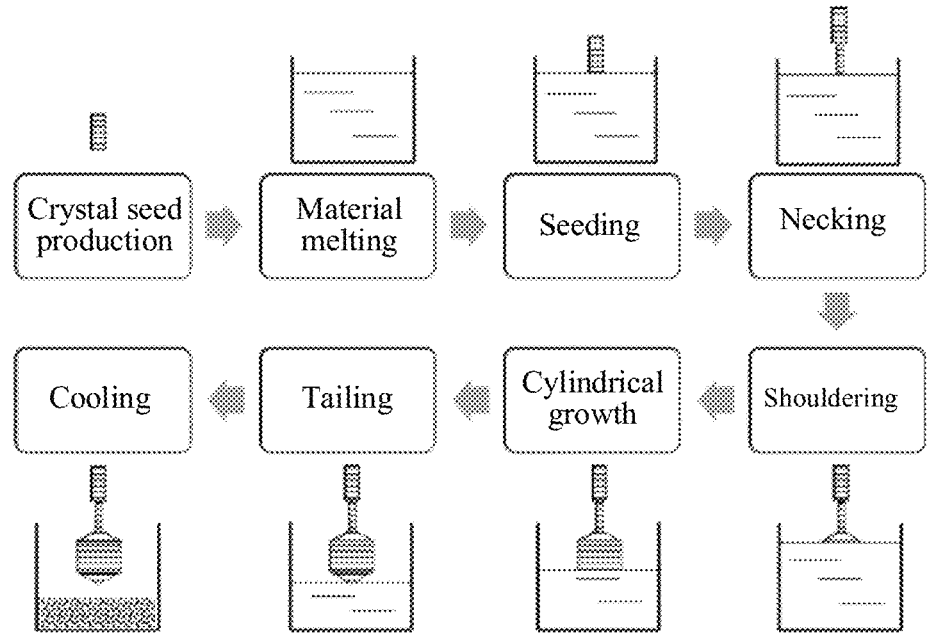
FIG. 4 is a growth flow chart of the CZ method.
Figure 5:
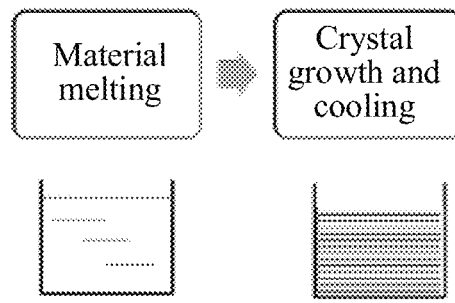
FIG. 5 is a growth flow chart of a casting method provided by the present disclosure.

Compared with the CZ method and the EFG method, the present disclosure effectively simplifies the growth process of the gallium oxide crystal (see FIG. 4 and FIG. 5 for the process flow). On the one hand, there is no need to use the single crystal seed which is difficult in production to induce crystal growth. On the other hand, the growth steps such as seeding, necking, shouldering, cylindrical growth, and tailing, which require a lot of adjustment of process parameters are not required, which saves the growth time. Compared with the conventional casting method, there is no need to lay the single crystal seed at the bottom, such that the single crystal nucleates and grows spontaneously, avoiding the bottom with more impurities and defects, so as to improve the crystal quality.

Detection of melting point of gallium oxide: the melting point of the gallium oxide can be tested by an infrared thermometer. Generally, the stage where the temperature is maintained is the melting point range of the gallium oxide. The actual measured melting point of the gallium oxide in the present disclosure is about 1,800° C.

Detection of volume fraction of oxygen: the volume fraction of the oxygen in the growth atmosphere can be detected in real time by an oxygen sensor.

Detection of single crystal quality: the peak shape and FWHM of the crystal are tested by a high-resolution X-ray rocking curve. A more symmetrical and sharper peak shape of the rocking curve indicates a smaller FWHM, and a smaller FWHM indicates higher single crystal quality.

Example 1

A method for growing a gallium oxide single crystal included the following specific steps.

(1) The commercially available gallium oxide powder with a purity of 99.999% was pressed into a round disk with a pressure of 20 MPa, and sintered at 1,200° C. for 10 h. The sintered disk was put into a $\phi$100 mm×100 mm container (such as an iridium crucible). The container containing the disk was put into the crystal growth furnace containing thermal insulation materials. The crystal growth furnace was sealed, vacuumized to be less than or equal to 1 Pa by a mechanical pump, and then filled with argon to make the pressure in the furnace equal to one atmosphere. A circulating cooling water device was opened.

The solid gallium oxide could be prepared by the above method, which could improve the filling efficiency. The purchased solid gallium oxide could also be directly used. The raw material for preparing the solid gallium oxide by the above method: the gallium oxide powder had a purity of preferably 99.999%. Using the gallium oxide with a purity of 99.999% as the raw material could reduce the introduction of impurities during the growth of the gallium oxide crystals and improve the quality of the obtained gallium oxide crystals. Pressing the gallium oxide powder into a disk could effectively reduce the volume of raw materials in the crucible, and avoid multiple filling and melting. Vacuumizing the crystal growth furnace and introducing the inert gas could reduce the oxygen in the furnace and avoid oxidation damage to the iridium crucible caused by high oxygen components in the air. The zirconia fiber bricks were used as the insulation materials to form a suitable temperature gradient, which directly affected the growth of the gallium oxide single crystal. The following examples and comparative examples are all applicable.

The size of the container is not affected by the crystal size, and other sizes can be selected.

(2) An intermediate frequency induction heating device was turned on to heat at a rate of 100-200° C./h to melt the raw materials in the crucible, and an infrared thermometer was used to monitor the temperature of the crucible and the disk. When the temperature of the disk reached the first temperature of 1,500° C., 2% volume fraction of oxygen was introduced at one time. The power was continuously increased to heat, and the disk was completely melted, such that the melt temperature was 5-10° C. larger than the melting point of the gallium oxide for 0.5-2 h. The heating power was decreased to cool the melt to the melting point of the gallium oxide for 30 min.

(3) The intermediate frequency induction power was decreased to slowly cool at the first gradient of 10° C./h, such that the melt on the surface of the crucible gradually solidified and grew into a gallium oxide crystal. During crystal growth, the argon and oxygen atmosphere in the crystal growth furnace were maintained, the micro-positive pressure state in the furnace was maintained, and the gas in the furnace was replaced with the argon when the temperature of the crystal in the crucible dropped to 1,500° C. through measurement with an infrared thermometer.

(4) The cooling rate was increased to a second gradient of 50° C./h to gradually cool the crystal. When the temperature in the furnace was completely cooled to the room temperature, the gallium oxide single crystal was obtained.

For the gallium oxide single crystal obtained in Example 1, it could be observed that the single crystal was transparent without obvious cracks and bubbles, and the size of the single crystal part reached $\phi$100 mm×50 mm. After cutting, grinding and polishing, a 4-inch single crystal substrate could be obtained.

Figure 6:
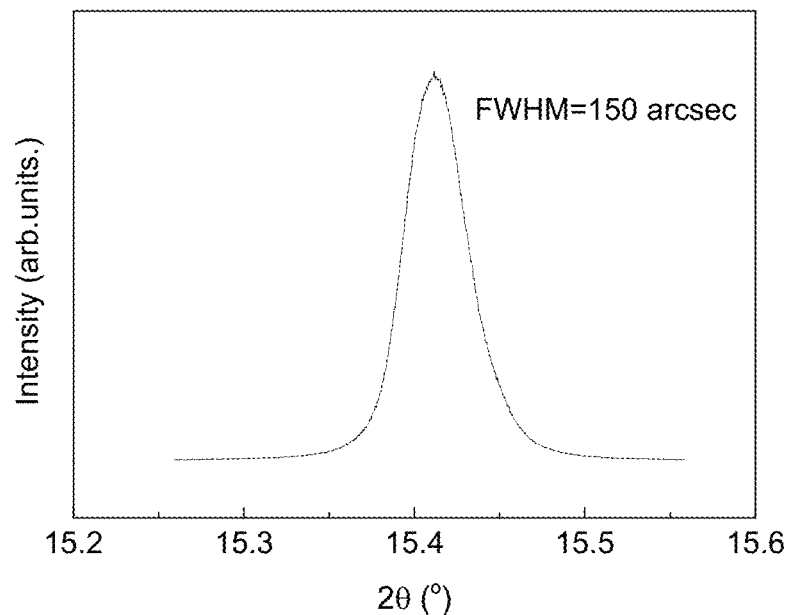
FIG. 6 is a high-resolution X-ray rocking curve graph measured by a gallium oxide single crystal substrate obtained in Example 1.

A high-resolution X-ray rocking curve of the (100) plane gallium oxide single crystal substrate obtained in the present example was tested. As shown in FIG. 6, the rocking curve is relatively symmetrical, and the FWHM is 150 arcsec, indicating that the single crystal quality is high.

Example 2

A method for growing a large-size bulk gallium oxide single crystal included the following specific steps.

(1) The gallium oxide powder with a purity of 99.999% was pressed into round disk with a pressure of 30 MPa, and sintered at 1,200° C. for 12 h. The sintered disk was put into a $\phi$50 mm×50 mm iridium crucible. The iridium crucible containing the disk was put into the crystal growth furnace containing thermal insulation materials of zirconia fiber bricks. The crystal growth furnace was sealed, vacuumized to be less than or equal to 1 Pa by a mechanical pump, and then filled with argon to make the pressure in the furnace equal to one atmosphere. A circulating cooling water device was opened.

(2) An intermediate frequency induction heating device was turned on to heat at a rate of 100-200° C./h to melt the raw materials in the crucible. When the temperature of the disk reached the first temperature of 1,600° C., 5% volume fraction of oxygen was introduced. The power was continuously increased to heat, and the disk was completely melted, such that the melt temperature was 60° C. larger than the melting point of the gallium oxide for 2 h. The heating power was decreased to cool the melt to the melting point of the gallium oxide for 30 min.

(3) The intermediate frequency induction power was decreased to slowly cool at the first gradient of 20° C./h, such that the melt on the surface of the crucible gradually solidified and grew into a gallium oxide crystal. The micropositive pressure state in the furnace was maintained, and the gas in the furnace was replaced with the argon when the temperature of the crystal in the crucible dropped to 1,600° C.

(4) The cooling rate was increased to a second gradient of 30° C./h to gradually cool the crystal. When the temperature in the furnace was completely cooled to the room temperature, the gallium oxide single crystal was obtained.

For the gallium oxide single crystal obtained in Example 2, it could be observed that the single crystal was transparent without obvious cracks and bubbles, and the size of the single crystal part reached $\phi$50 mm×20 mm. After cutting, grinding and polishing, a 2-inch single crystal substrate could be obtained.

Figure 7:
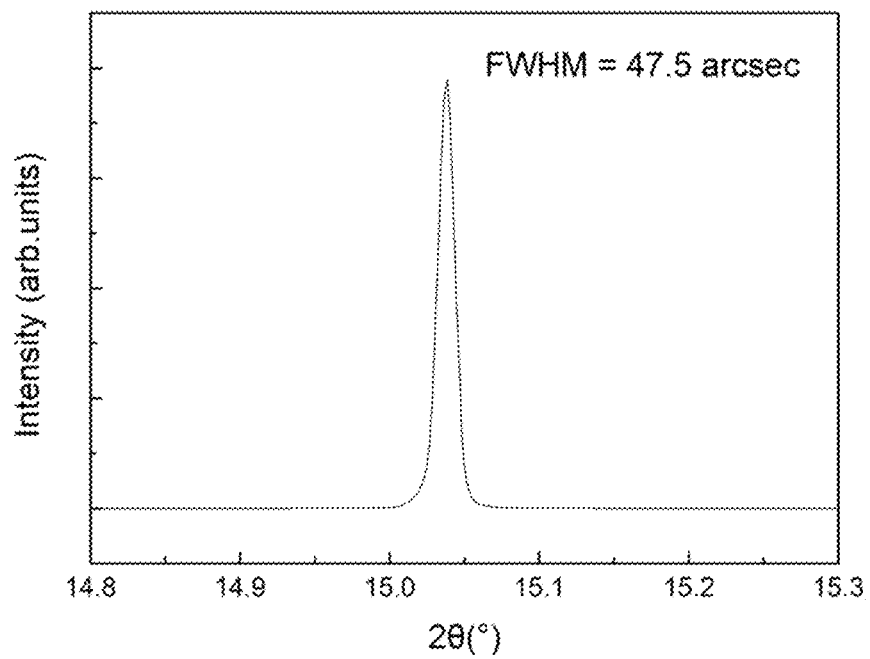
FIG. 7 is a high-resolution X-ray rocking curve graph measured by a gallium oxide single crystal substrate obtained in Example 2.

A high-resolution X-ray rocking curve of the (100) plane gallium oxide single crystal substrate obtained in the present example was tested. As shown in FIG. 7, the rocking curve is in bilateral symmetry, and the FWHM is 47.5 arcsec, indicating that the gallium oxide single crystal quality is high.

Example 3

A method for growing a large-size bulk gallium oxide single crystal included the following specific steps.

(1) The gallium oxide powder with a purity of 99.999% was pressed into round disk with a pressure of 30 MPa, and sintered at 1,200° C. for 12 h. The sintered disk was put into a $\phi$80 mm×80 mm iridium crucible. The iridium crucible containing the disk was put into the crystal growth furnace containing thermal insulation materials of zirconia fiber bricks. The crystal growth furnace was sealed, vacuumized to be less than or equal to 1 Pa by a mechanical pump, and then filled with argon to make the pressure in the furnace equal to one atmosphere. A circulating cooling water device was opened.

(2) An intermediate frequency induction heating device was turned on to heat at a rate of 100-200° C./h to melt the raw materials in the crucible. When the temperature of the disk reached the first temperature of 1,700° C., 10% volume fraction of oxygen was introduced. The power was continuously increased to heat, and the disk was completely melted, such that the melt temperature was 100° C. larger than the melting point of the gallium oxide for 2 h. The heating power was decreased to cool the melt to the melting point of the gallium oxide for 50 min.

(3) The intermediate frequency induction power was decreased to slowly cool at the first gradient of 15° C./h, such that the melt on the surface of the crucible gradually solidified and grew into a gallium oxide crystal. The gas in the furnace was replaced with the argon when the temperature of the crystal in the crucible dropped to 1,700° C.

(4) The cooling rate was increased to a second gradient of 40° C./h to gradually cool the crystal. When the temperature in the furnace was completely cooled to the room temperature, the gallium oxide single crystal was obtained.

For the gallium oxide single crystal obtained in Example 3, it could be observed that the single crystal was transparent without obvious cracks and bubbles, and the size of the single crystal part reached $\phi$80 mm×40 mm. After cutting, grinding and polishing, a 3-inch single crystal substrate could be obtained.

Examples 4 to 13

Examples 4 to 13 adopted the preparation method as in Example 1 to prepare a gallium oxide single crystal, and changed some experimental parameters: the first temperature, the melting point holding time, the volume fraction of the oxygen, the first gradient, the replaced inert gas, and the second gradient, etc. As shown in Table 1 below, a large-size bulk gallium oxide single crystal without obvious cracks can be finally obtained. The (100), (010) and (001) plane gallium oxide single crystal substrates obtained by processing had no problems of cracking, twinning and bubbles. After high-resolution X-ray rocking curve testing, the FWHM was less than 150 arcsec, indicating that the single crystal quality was high.

TABLE 1

| Example SN | First temperature (° C.) | Melt holding time (min) | Volume fraction of oxygen (%) | First gradient (° C./h) | Replaced inert gas | Second gradient (° C./h) |
| --- | --- | --- | --- | --- | --- | --- |
| Example 4 | 1500 | 30 | 2 | 10 | Ar | 20 |
| Example 5 | 1500 | 40 | 5 | 20 | Ar | 30 |
| Example 6 | 1500 | 40 | 5 | 30 | Ar | 50 |
| Example 7 | 1500 | 50 | 10 | 40 | $N_2$ | 60 |
| Example 8 | 1600 | 30 | 2 | 10 | Ar | 20 |
| Example 9 | 1600 | 50 | 3 | 15 | Ar | 100 |
| Example 10 | 1600 | 50 | 5 | 20 | $N_2$ | 40 |
| Example 11 | 1700 | 30 | 5 | 20 | Ar | 30 |
| Example 12 | 1700 | 40 | 8 | 90 | Ar | 50 |
| Example 13 | 1700 | 50 | 10 | 40 | $N_2$ | 60 |

Comparative Example 1

The same growth method and equipment as in Example 1 were used, except that the first gradient was directly cooled to the room temperature at a rate of 100° C./h (without the second gradient), such that the melt on the surface of the crucible was gradually solidified and grown into a gallium oxide crystal. When the temperature in the furnace was completely cooled to the room temperature, the crystal growth furnace was opened and the crucible was taken out. After detection, the crystal in the crucible was a polycrystal and could not be used.

Compared with Example 1, Comparative Example 1 did not undergo gradient cooling, and the cooling rate was too high, which was the main reason for the failure to form a single crystal.

Comparative Example 2

The same growth method and equipment as in Example 1 were used, except that the first gradient was directly cooled to the room temperature at a rate of 200° C./h (without the second gradient), such that the melt on the surface of the crucible was gradually solidified and grown into a gallium oxide crystal. When the temperature in the furnace was completely cooled to the room temperature, the crystal growth furnace was opened and the crucible was taken out. After detection, the crystal in the crucible was a polycrystal and could not be used.

Compared with Example 1, Comparative Example 2 did not undergo gradient cooling, and the cooling rate was too high, which was the main reason for the failure to form a single crystal.

Comparative Example 3

The same growth method and equipment as in Example 1 were used, except that oxygen was not introduced when the temperature rose to the first temperature, such that the melt on the surface of the crucible was gradually solidified and grown into a gallium oxide crystal. When the temperature in the furnace was completely cooled to the room temperature, the crucible was taken out for detection. There were large crystalline impurities in the center of the crystal, leading to the formation of the polycrystal.

Compared with Example 1, Comparative Example 3 did not introduce the oxygen during the growth of the single crystal, and a large amount of gallium oxide was volatilized and decomposed, and reacted with the crucible material to form floating objects that accumulated in the center of the crucible, unable to form a single crystal.

Comparative Example 4

The same growth method and equipment as in Example 1 were used, except that only 1% oxygen was introduced when the temperature rose to the first temperature, such that the melt on the surface of the crucible was gradually solidified and grown into a gallium oxide crystal. When the temperature in the furnace was completely cooled to the room temperature, the crucible was taken out for detection. There were large crystalline impurities in the center of the crystal, leading to the formation of the polycrystal.

Compared with Example 1, Comparative Example 4 did not introduce enough oxygen during the growth of the single crystal, and the gallium oxide was still volatilized and decomposed, and reacted with the crucible material to form floating objects that accumulated in the center of the crucible, unable to form a single crystal.

Comparative Example 5

The same growth method and equipment as in Example 1 were used, except that the gallium oxide was directly cooled after melting, and there was no maintenance procedure, such that the melt on the surface of the crucible was gradually solidified and grown into a gallium oxide crystal. When the temperature in the furnace was completely cooled to the room temperature, the crucible was taken out and a polycrystal was detected.

Compared with Example 1, Comparative Example 5 did not maintain the melting point of gallium oxide for 30 min, resulting in the presence of gallium oxide solid particles in the melt, and multi-point nucleation could not form a single crystal during cooling.

It can be seen from the above examples and comparative examples that the heat preservation procedure of the gallium oxide melt, reasonable gradient cooling and a suitable volume fraction of the oxygen are the necessary conditions for obtaining a large-size bulk gallium oxide single crystal by casting. The present disclosure is not limited to the above-mentioned examples, and any solution after improvement or transformation of the present disclosure shall fall within the protection scope of the appended claims of the present disclosure.

What is claimed is:

1. A method for growing a gallium oxide single crystal by casting, comprising the following steps:
   1) Heating a solid gallium oxide to complete melting, cooling to a melting point of the gallium oxide, and maintaining a melt state for at least 30 min; and
   2) conducting gradient cooling on a gallium oxide melt obtained in step 1) until a solid gallium oxide single crystal is obtained, wherein the gradient cooling is to cool the gallium oxide melt obtained in step 1) to a first temperature according to a first gradient, and then continue cooling to a room temperature according to a second gradient to obtain the gallium oxide single crystal, and
   in step 1), since the solid gallium oxide is heated to the first temperature, oxygen with a volume fraction of 2-10% is present in a growth atmosphere; and the growth atmosphere comprises an inert gas;
   wherein:
   a cooling rate of the first gradient is 10-20° C./h;
   a cooling rate of the second gradient is 30-60° C./h;
   the first temperature is 1,500-1,700° C.; and
   the method does not use a single crystal seed.

2. The method according to claim 1, wherein in step 1), before or when heating to the first temperature, the oxygen is introduced so that the volume fraction of the oxygen in the growth atmosphere reaches 2-10%.

3. The method according to claim 1, wherein in step 2), when the cooling is continued to the first temperature according to the first gradient, the oxygen in the growth atmosphere is replaced with an inert gas.

4. The method according to claim 1, wherein the inert gas is one or more selected from the group consisting of argon, nitrogen, and carbon dioxide.

5. The method according to claim 1, wherein the gallium oxide single crystal has a diameter of 2-4 inches.

* * * * *